United States Patent [19]
Hobrecht et al.

[11] Patent Number: 5,013,934
[45] Date of Patent: May 7, 1991

[54] BANDGAP THRESHOLD CIRCUIT WITH HYSTERESIS

[75] Inventors: Stephen W. Hobrecht, Los Altos; Michael C. L. Chow, San Mateo, both of Calif.

[73] Assignee: National Semiconductor Corporation, Santa Clara, Calif.

[21] Appl. No.: 350,354

[22] Filed: May 8, 1989

[51] Int. Cl.[5] .......................... H03K 3/01; H03K 3/26; H03K 3/29; G05F 3/16

[52] U.S. Cl. .............................. 307/296.7; 307/296.1; 307/296.6; 307/310; 307/350; 323/313; 323/315; 323/907

[58] Field of Search ............... 307/296.1, 296.6, 296.7, 307/310, 290, 350; 323/313, 315, 907

[56] References Cited

U.S. PATENT DOCUMENTS

| | | | |
|---|---|---|---|
| 4,677,369 | 6/1987 | Bowers et al. | 307/296.7 |
| 4,701,639 | 10/1987 | Stanojevic | 307/350 |
| 4,808,908 | 2/1989 | Lewis et al. | 323/315 |

OTHER PUBLICATIONS

Paul Brokaw, "A Simple Three-Terminal IC Bandgap Reference", IEEE Journal of Solid-State Circuits, vol. SC9, No. 6, Nov. 1974.

*Primary Examiner*—Stanley D. Miller
*Assistant Examiner*—Trong Quang Phan
*Attorney, Agent, or Firm*—Gail W. Woodward; Lee Patch; Michael A. Glenn

[57] ABSTRACT

A combined CMOS/linear circuit employs a voltage reference circuit to provide a temperature compensated $V_{REF}$ output. The circuit includes means for switching the reference circuit off and on in response to the signal on an enable terminal. The voltage reference circuit includes a current mirror feedback which is positive in nature to provide a controlled hysteresis action. This provides noise immunity for the enable input. A digital output indicator is included to indicate the state of the reference circuit.

5 Claims, 1 Drawing Sheet

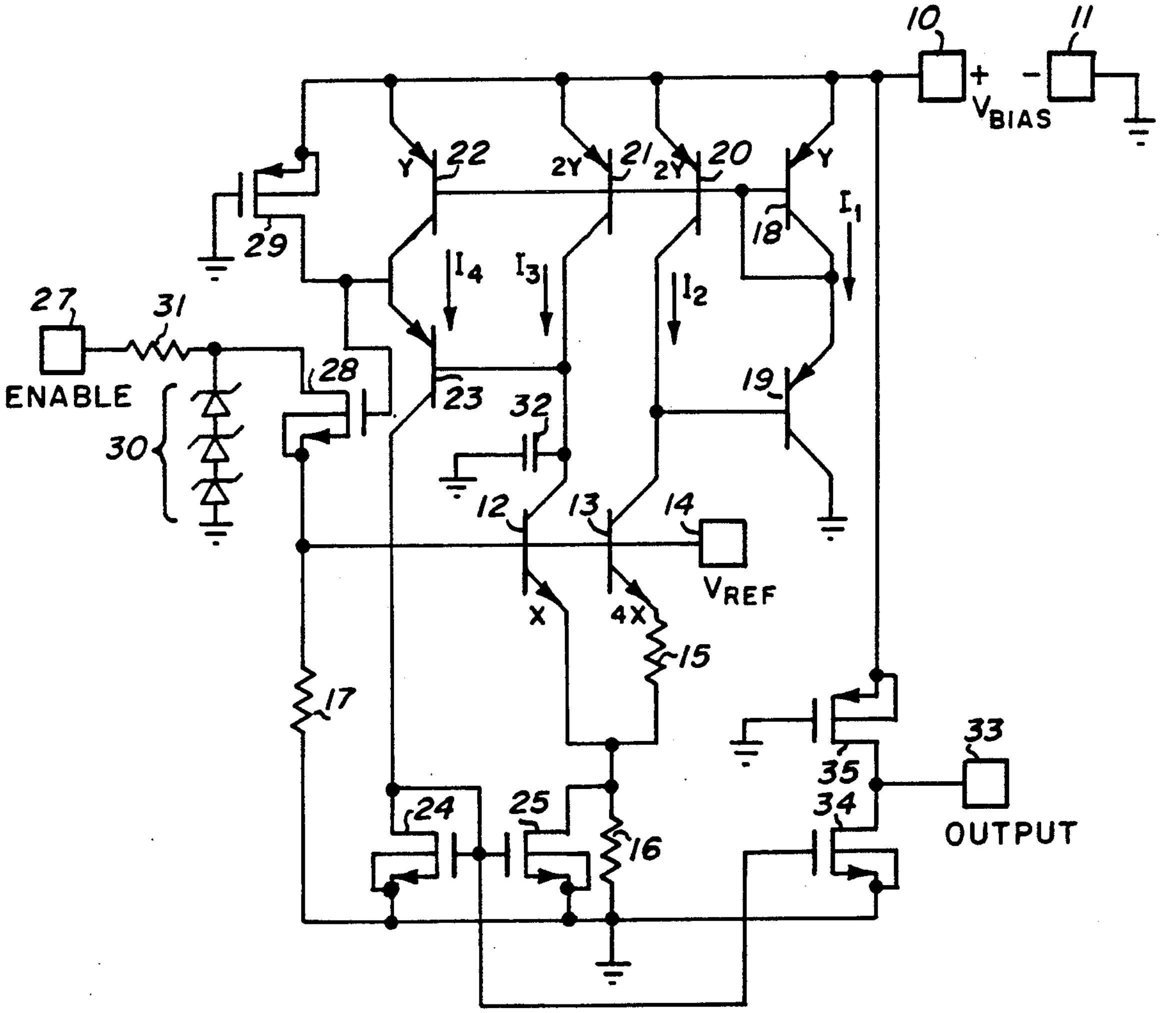
10
11
+
-
VBIAS
22
21
20
Y
2Y
2Y
Y
18
I1
29
I4
I3
I2
27
31
ENABLE
28
19
23
32
30
12
13
14
X
4X
VREF
15
17
35
33
34
24
25
16
OUTPUT

BANDGAP THRESHOLD CIRCUIT WITH HYSTERESIS

BACKGROUND OF THE INVENTION

The invention relates to a bandgap reference circuit which produces a reference voltage that is temperature compensated. An enable signal input can be employed to render the circuit in either its active or inactive state.

An early threshold detector based upon a reference circuit is disclosed in Stanojevic U.S. Pat. No. 4,701,639. This patent issued Oct. 20, 1987, is assigned to the assignee of the present invention and its teaching is incorporated herein by reference. In this invention an output signal is provided as a function of an applied voltage. The threshold voltage is based upon a temperature compensated bandgap circuit of known construction.

The temperature compensated bandgap circuit is of the configuration disclosed by A. Paul Brokaw in the IEEE Journal of Solid-State Circuits Vol SC-9, No 6, Dec. 6, 1974, (pages 388–393). The paper is titled "A Simple Three-Terminal IC Bandgap Reference". The teaching in this paper is incorporated herein by reference.

In the Brokaw circuit two transistors are operated at ratioed current densities to develop a differential base to emitter voltage ($\Delta V_{BE}$). The emitters are coupled together and a resistor is incorporated in series with the emitter of the low current density transistor. The high density transistor emitter is returned to the power supply terminal by way of a second resistor. The collectors of the two transistors are returned to the other supply terminal. The transistor bases are coupled together and are operated at a potential that is equal to the silicon bandgap extrapolated to absolute zero. The base voltage is composed of a positive temperature coefficient portion that appears across the second resistor in series with a negative temperature coefficient voltage which is due to the $V_{BE}$ of the high current density transistor.

When using the Brokaw configuration in the Stanojevic threshold detector circuit a temperature compensated threshold reference is available. However, the reference voltage is not available as an output. One of the attributes of the Stanojevic circuit is that the circuit is powered from, and all of the circuit current flows from the control terminal.

SUMMARY OF THE INVENTION

It is an object of the invention to provide a temperature compensated bandgap reference circuit which can be switched on and off by way of an enable input.

It is a further object of the invention to provide a temperature compensated bandgap reference that is capable of being switched on and off and produces a reference that is not affected by the supply potential.

It is a still further object of the invention to provide a temperature compensated bandgap reference which can be switched on and off by means of an enable signal applied to a control terminal that does not draw any current when the circuit is off and is insensitive to control signal variations when on.

It is a still further object of the invention to provide hysteresis in the switching characteristics of a temperature compensated bandgap reference so that noise at the enable input will not produce false switching.

These and other objects are achieved in a circuit configured as follows. A pair of transistors have their emitter areas ratioed and the large area device has a first resistor in series with its emitter. Both emitters are commonly returned to one power supply terminal by way of a second resistor. The collectors of the pair of transistors are returned to the other power supply terminal by way of a current mirror that passes equal currents to each transistor in the pair. The current mirror has an additional output that drives a feedback current mirror via a coupling transistor. The feedback current mirror has an output that is coupled across the second resistor. Thus, a positive feedback loop exists around the transistor pair and the feedback magnitude is controlled so that a controlled hysteresis exists in the transistor pair conduction. The bases of the transistor pair are connected to a $V_{REF}$ terminal and are returned to the one power supply terminal by way of a third resistor. A control transistor is coupled between the commonly connected bases and the enable signal terminal. The control electrode of the control transistor is connected to the emitter of a coupling transistor connected to complete a negative feedback loop which exists around the collector-base circuit of the high current density transistor of the pair. This action stabilizes the conduction in the pair so that the $\Delta V_{BE}$ that exists across the first resistor determines the circuit conduction. Its value is selected so that the potential at the commonly connected bases is at the silicon bandgap extrapolated to absolute zero temperature. Hence, a temperature stabilized potential of about 1.2 volts is present at the $V_{REF}$ terminal. As long as the enable terminal is high the control transistor will conduct and pull the commonly connected bases up and the transistor pair will conduct. When the enable terminal is low there will be no conduction in the control transistor and therefore no current will flow in the third resistor. For this condition the transistor pair will be off and the $V_{REF}$ terminal will be at zero potential.

BRIEF DESCRIPTION OF THE DRAWING

The single FIGURE of drawing is a schematic diagram of the circuit of the invention.

DESCRIPTION OF THE INVENTION

With reference to the single figure of drawing, the circuit operates from a $V_{BIAS}$ power supply connected + to terminal 10 and − to ground terminal 11. In the following discussion, it will be assumed that the bipolar transistors all have high Beta. Accordingly, the base currents, which are typically less than one percent of the collector currents, will be neglected.

The heart of the circuit is transistor pair 12 and 13 which have their bases commonly connected to $V_{REF}$ terminal 14. As shown, transistor 13 has four times the area of transistor 12 and it has resistor 15 in series with its emitter. The pair has its emitters returned to ground via common resistor 16. Resistor 17 returns the common bases of transistors 12 and 13 to ground.

Transistors 18–20 form a Wilson current mirror in which the currents flowing in transistors 19 and 20 are closely controlled. Since transistor 20 has twice the area of transistor 18, I2 is twice the value of I1 which flows in transistors 18 and 19. Because of their connections related currents will flow in transistors 21 and 22. I3, which flows in transistor 21, will be equal to twice the value of I1 and I4 which flows in transistor 22 will be equal to I1. It will be noted that the currents flowing in transistors 12 and 13 are matched and each transistor drives a similar load to create a balance therebetween.

Transistor 23 provides a feedback coupling action, that will be explained hereinafter, and conducts I4 which also flows in transistor 24. Transistors 24 and 25 form a current mirror the output of which is in parallel with resistor 16. This feedback from the collector circuit of transistors 12 and 13 back to their emitters is positive or regenerative in nature and thereby provides a hysteresis characteristic for the circuit. This means that when the circuit is on, the potential at $V_{REF}$ terminal 14 is about 1.2 volts. When the circuit is off, the threshold is raised slightly (about 25 millivolts) which has to be exceeded to start the circuit. Such a characteristic is very useful in improving the circuit noise immunity at enable terminal 27.

When enable terminal 27 is low, no current will flow in transistor 28 and thus no current will flow in resistor 17. As a result, $V_{REF}$ terminal 14 will be at zero volts. Thus, no current will flow in transistors 12 and 13 and the circuit will be off. Accordingly, no current will flow in transistors 18 through 25.

When enable terminal 27 is high (or at least above the circuit upper threshold) it will attempt to turn transistor 28 on. When the circuit is off it can be seen that transistor 29 acts as a startup device. It is a long narrow P channel FET with its gate grounded so that it acts as a high value resistor. Its conduction, though slight, will be sufficient to pull the gate of transistor 28 up to ensure conduction therein when enable terminal 27 is high. As a practical matter, when the circuit is on, the conduction of transistor 29 is much smaller than I4. Thus, when the circuit is to be enabled by the signal at terminal 27, conduction in transistor 28 will pull $V_{REF}$ terminal up and turn the circuit on.

Diodes 30 will normally be non-conductive, but when their combined zener voltages is exceeded they will conduct and, in combination with resistor 31, will clamp the potential applied to the drain of transistor 28 to a safe value. The combined zener breakdown, which will be on the order of 20 volts, provides electrostatic discharge (ESD) protection at terminal 27. Capacitor 32 is a frequency compensation capacitor included for circuit stability.

When the circuit is on the voltage drop across resistor 15 will be equal to the $\Delta V_{BE}$ between transistors 12 and 13. This will be:

$$\Delta V_{BE} = \ln \frac{J12}{J13} \cdot \frac{kT}{q}$$

where:

J12/J13 is the transistor current density ratio;

k is Boltzmanns constant;

T is absolute temperature; and q is the charge on an electron.

For the circuit shown (having a current density ratio of four), at a temperature of 300° K., $\Delta V_{BE}$ will be about thirty-six millivolts. Thus, for a 720 ohm resistor 15, I2 will be about fifty microamperes. This means that about one hundred microamperes will flow in the transistor pair. With the indicated transistor ratios I4 will be about twenty-five microamperes. In the preferred embodiment, transistor 25 is made about sixty-two percent of the size of transistor 24. Thus, the current flowing in transistor 25 will be about sixteen microamperes or about sixteen percent of the total current in transistors 12 and 13. This ratio will introduce a 300° K. hysteresis of about twenty-five millivolts for the circuit. Thus, while the circuit produces a temperature constant 1.2 volts at terminal 14 when on, it has a turn-on threshold of about 1.225 volts. This translates to a terminal 27 turn-on threshold of about 1.7 volts.

While the circuit output is actually $V_{REF}$ at terminal 14, a digital output can be provided, as shown, at terminal 33. This is done by connecting the gate of N channel transistor 34 to the gate of transistor 24. The drain of transistor 34 is returned to terminal 10 by way of P channel transistor 35 which has its gate grounded and is a long narrow structure that has a relatively low conduction. When the circuit is off transistor 35 will pull terminal 33 up close to $V_{BIAS}$. When the circuit is on transistor 34 will overpower transistor 35 and pull terminal 33 close to ground. Thus, the rail-to-rail swing of terminal 33 provides a flag of the circuit conduction.

EXAMPLE

The circuit of the drawing was constructed using a compatible composite CMOS/linear silicon, epitaxial, monolithic, PN junction-isolated process. The following critical components were employed:

| COMPONENT | VALUE OR W/L (MICRONS) |
|---|---|
| Resistor 15 | 720 ohms |
| Resistor 16 | 6.7k ohms |
| Resistor 17 | 125k ohms |
| Transistor 24 | N channel 40/5 |
| Transistor 25 | N channel 25/5 |
| Transistor 28 | N channel 100/15 |
| Transistor 29 | P channel 6/46 |
| Capacitor 32 | 15 picofarads |

The circuit produced a $V_{REF}$ of about 1.2 volts when on. This voltage varied less than 16 mv over the temperature range of −45° C. to 125° C. The circuit displayed a hysteresis characteristic of about 25 mv and thus had a comfortable noise immunity to signals at terminal 27. The circuit displayed a supply rejection ratio at terminal 10 of about 34 db at 1 kHz.

The invention has been described, its operation detailed and a working example set forth. When a person skilled in the art reads the foregoing description, alternatives and equivalents, within the spirit and intent of the invention, will be apparent. Accordingly, it is intended that the scope of the invention be limited only by the following claims.

We claim:

1. A voltage reference circuit that can be switched on and off in response to an enable signal, that produces a voltage insensitive to temperature, voltage BIAS, and enabling voltage input variations, said circuit comprising:

voltage reference means having an input coupled to receive said enable signal and having a pair of transistors operating at different current densities whereby a differential base to emitter voltage is developed to be proportional to absolute temperature;

means responsive to said enable signal for turning said voltage reference means off and on;

means for controlling said current densities to maintain a constant ratio independent of temperature; and means responsive to said enable signal for providing positive feedback around said voltage reference means whereby hysteresis is introduced into the switching thereof.

2. The switchable voltage reference circuit of claim 1 wherein said pair of transistors are ratioed in size and a first current mirror having two current source outputs is employed to operate the pair at the same collector currents.

3. The switchable voltage reference circuit of claim 2 wherein said first current mirror includes an additional current source that supplies current to a turnaround second current mirror that has an output coupled to the emitters of said pair of transistors thereby completing a positive feedback action to introduce said hysteresis into the switching of said pair of transistors.

4. The switchable voltage reference of claim 3 wherein said turnaround second current mirror is further coupled to drive an output flag indicator circuit.

5. The switchable voltage reference of claim 3 wherein a FET is employed as the means for switching of said circuit, said FET having its source coupled to said pair of transistors, its gate coupled to said additional current source and its drain coupled to said enable signal input.

* * * * *